United States Patent
Imai

(10) Patent No.: US 7,931,354 B2
(45) Date of Patent: Apr. 26, 2011

(54) CIRCUIT BOARD FOR INKJET HEAD

(75) Inventor: Koji Imai, Inuyama (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 798 days.

(21) Appl. No.: 11/472,523

(22) Filed: Jun. 22, 2006

(65) Prior Publication Data

US 2006/0290742 A1 Dec. 28, 2006

(30) Foreign Application Priority Data

Jun. 23, 2005 (JP) ................................. 2005-183413

(51) Int. Cl.
*B41J 2/14* (2006.01)
(52) U.S. Cl. ........................................................ 347/50
(58) Field of Classification Search .................... 347/69, 347/50, 71; 228/180.21, 101, 180.5; 438/106, 438/200, 540; 257/737
See application file for complete search history.

(56) References Cited

U.S. PATENT DOCUMENTS

| | | | |
|---|---|---|---|
| 2002/0031880 A1* | 3/2002 | Chien et al. | 438/200 |
| 2002/0079576 A1* | 6/2002 | Seshan | 257/737 |
| 2003/0030705 A1* | 2/2003 | Koike et al. | 347/69 |
| 2004/0053483 A1* | 3/2004 | Nair et al. | 438/540 |
| 2004/0060969 A1* | 4/2004 | Imai et al. | 228/180.21 |
| 2004/0130604 A1* | 7/2004 | Watanabe et al. | 347/71 |
| 2005/0179747 A1 | 8/2005 | Iamai et al. | |
| 2005/0239233 A1* | 10/2005 | Shinkai | 438/106 |
| 2005/0279812 A1* | 12/2005 | Tago et al. | 228/180.5 |
| 2006/0226200 A1* | 10/2006 | Banno et al. | 228/101 |

FOREIGN PATENT DOCUMENTS

| | | |
|---|---|---|
| JP | H0575253 | 3/1993 |
| JP | 3055146 | 4/2000 |
| JP | 3171219 | 3/2001 |
| JP | 2004114609 | 4/2004 |
| JP | 2004-319692 A | 11/2004 |
| JP | 2005-161760 A | 6/2005 |
| JP | 2005212238 | 8/2005 |

* cited by examiner

Primary Examiner — Stephen D Meier
Assistant Examiner — Carlos A Martinez, Jr.
(74) Attorney, Agent, or Firm — Baker Botts L.L.P.

(57) ABSTRACT

Second individual electrodes are formed and arranged in zigzag in two rows on one surface of a flexible sheet, and wirings connected to the second individual electrodes are arranged to pass between adjacent second individual electrodes of the other row. Formed on the other surface of the flexible sheet are electrode connection sections to be connected to the second individual electrodes through through-holes going through the flexible sheet. The electrode connection section has an area larger than the second individual electrode and is connected to an external electrode through solder.

9 Claims, 7 Drawing Sheets

CIRCUIT BOARD FOR INKJET HEAD

CROSS-REFERENCE TO RELATED APPLICATION

This non-provisional application claims priority under 35 U.S.C. §119(a) on Patent Application No. 2005-183413 filed in Japan on Jun. 23, 2005, the entire contents of which are hereby incorporated by reference.

BACKGROUND

The present invention relates to a circuit board that comprises a board on which electrodes, wirings and through-holes are formed and is used for connecting to an actuator of an inkjet head, for example, and relates to an inkjet head.

The inkjet head records images, such as letters and figures, on recording paper by ejecting ink from nozzle holes while moving relative to the recording paper. The inkjet head has a plurality of rows of nozzle holes arranged in a line along the moving direction of the recording paper, and incorporates an actuator (for example, a piezoelectric element) for ejecting the ink from each nozzle hole, an IC chip for driving the actuator, and a circuit board for connecting the actuator and the IC chip (see Japanese Patent Application Laid-Open No. 2004-114609).

FIG. 1 is a plan view showing the structure of a conventional circuit board, and FIG. 2 is a cross sectional view along the VI-VI line of FIG. 1. A plurality of electrodes 31, 31, . . . having an oval shape in the plan view are formed on one surface of a flexible sheet 1 made of an insulating film. The electrodes 31, 31, . . . are lined in the width direction of the electrodes 31, 31, . . . to form electrode rows 130, 130, . . . , and further the electrode rows 130, 130, . . . are arranged in a longitudinal direction of the electrodes 31, 31 . . . so that the electrodes 31, 31, . . . included in adjacent electrode rows 130 and 130 form a zigzag pattern.

A wiring 32 with a width shorter than the length in a width direction (hereinafter referred to as the width) of the electrode 31 is connected to each electrode 31 at one end portion in the longitudinal direction, runs in the arrangement direction of the electrode rows 130, 130, . . . to pass between the electrodes 31 and 31 adjacent to each other in the row direction, and is connected to an IC chip, not shown.

On one surface of the flexible sheet 1, an insulating layer 11 is formed to cover the electrodes 31, 31, . . . and the wirings 32, 32, . . . .

Moreover, in the flexible sheet 1, through-holes 10, 10, . . . having an oval shape in the plan view and a longitudinal direction equal to the longitudinal direction of the electrodes 31, 31, . . . are formed at the positions where the electrodes 31, 31, . . . are formed. The opening area of each through-hole 10 in one surface of the flexible sheet 1 (the surface where the electrodes 31, 31, . . . are formed) is smaller than the area of the electrode 31. On the other hand, the opening area in the other surface is larger than the above-mentioned opening area and is substantially equal to the area of the electrode 31.

An electrically conductive brazing filler metal (solder) H is deposited thicker than the thickness of the flexible sheet 1 onto each electrode 31 from the other surface of the flexible sheet 1 through the through-hole 10, and the electrode 31 is connected, for example, to an individual electrode 41 corresponding to an individual nozzle hole (not shown) of an actuator 4 through the deposited solder H.

SUMMARY

In recent years, in order to improve the resolution of images, increase the number of colors of inks, etc., it has been required to increase the number of nozzle holes and place the nozzle holes at high density, and thus it is also necessary to place a greater number of electrode rows 130, 130, . . . and electrodes 31, 31, . . . of each electrode row 130 at high density. In order to increase the number of electrode rows 130, 130, . . . , it is also necessary to increase the number of the wirings 32, 32, . . . passing between the electrodes 31 and 31. Moreover, in order to arrange the electrodes 31, 31, . . . at high density, it is necessary to decrease the formation pitch between adjacent electrodes 31 and 31 in the row direction.

In the above-mentioned case, in order to pass the wiring 32 between the electrodes 31 and 31 after ensuring a connection area for the electrode 31 and the individual electrode 41 of the actuator 4, it is necessary to decrease the wiring pitch of the wirings 32, 32, . . . in the direction of the electrode rows 130, 130, . . . , and therefore the manufacturing cost of the circuit board increases. Further, it is impossible to realize a high-density arrangement of nozzle holes with a wiring pitch exceeding the manufacturing limit.

In order to solve the above problems, there is an option to ensure a necessary length for the wiring pitch by reducing the area of each of the electrodes 31, 31, . . . and increasing the separation distance between the electrodes 31, 31 . . . in the direction of the electrode rows 130, 130, . . . . However, if the area of the electrode 31 is reduced, it is also necessary to reduce the opening area of the through-hole 10, and consequently it may be difficult to deposit the solder H on the electrode 31 through the through-hole 10, and the deposit amount of the solder H may also decrease. As a result, defects sometimes occurred at the connection of the electrode 31 and the individual electrode 41 through the solder H.

On the other hand, in the case where the formation pitch of the electrodes 31, 31, . . . in the direction of the electrode rows 130, 130, . . . is increased without changing the area of each of the electrodes 31, 31, . . . , the length of the electrode rows 130, 130, . . . increases and the size of the circuit board increases, and consequently the size of the inkjet head increases. In other words, it is difficult to realize a high resolution inkjet head.

In view of such situation, it is an object to provide a circuit board capable of ensuring an electrode formation pitch and a wiring pitch and placing the electrodes at high density, without being limited by the size of an electrode connection section to be connected to the electrode formed on one surface of a board, by forming the electrode connection section on the other surface of the board, and to provide an inkjet head comprising the circuit board and having high resolution or a large number of nozzle holes.

A circuit board according to a first aspect is a circuit board comprising: a plurality of electrode rows arranged on one surface of a board; wirings formed on said one surface and connected to a plurality of electrodes, respectively, included in said electrode rows; through-holes formed in the board, corresponding to said plurality of electrodes, respectively; and electrode connection sections formed on other surface of the board to face and be connected to an external electrode group, said electrode connection section having an area larger than an area of said electrode and being connected to said electrode through said through-hole, wherein the wiring connected to the electrode included in one of said electrode rows is formed to pass between the electrodes included in other electrode row in an arrangement direction of said electrode rows, and said through-hole has an area smaller than the area of said electrode.

An inkjet head according to a second aspect is an inkjet head comprising: an actuator having an electrode group corresponding to each of a plurality of nozzle holes, for ejecting ink from each of the nozzle holes; and a circuit board connected to the actuator, and wherein the circuit board is the circuit board of the first aspect, and each of the plurality of electrode connection sections is arranged to face the electrode group, and the electrode connection sections and the electrodes included in the electrode group are connected.

According to the circuit board of the first aspect and the inkjet head of the second aspect, the electrodes and the wirings are formed on one surface of the board, and the electrode connection sections to be connected to the electrodes through the through-holes are formed on the other surface of the board. The electrode connection section has a larger area than the electrode on one surface of the board, and is connected to an external electrode group. Therefore, a large area of the electrode connection section can be connected to the external electrode group irrespective of the electrode rows and wirings, and it is possible to reduce connection defects between the electrode row and the external electrode group.

Further, since the area of the electrode can be reduced, it is possible to increase the separation distance between the electrodes if the formation pitch of the electrodes is the same, and it is possible to ensure a sufficient length for the wiring pitch in the row direction of the wirings passing between the electrodes and increase the number of the wirings. In other words, if the number of the wirings passing between the electrodes is the same, the formation pitch of the electrodes can be decreased. Accordingly, it is possible to realize a high-density circuit board, or a circuit board with a large number of electrodes.

When such a circuit board is incorporated into an inkjet head and the electrode rows and the electrode groups of the actuators are connected, it is possible to reduce the manufacturing defects of the inkjet head due to connection defects since the electrode rows and the electrode groups are constructed as described above. In addition, even when the number or density of the electrode groups of the actuators is increased, it is possible to ensure the electrode pitch and wiring pitch on the circuit board side, thereby realizing an inkjet head comprising a large number of or high density nozzle holes.

The above and further objects and features will more fully be apparent from the following detailed description with accompanying drawings.

DETAILED DESCRIPTION OF THE EXEMPLARY EMBODIMENT

Figure 1:
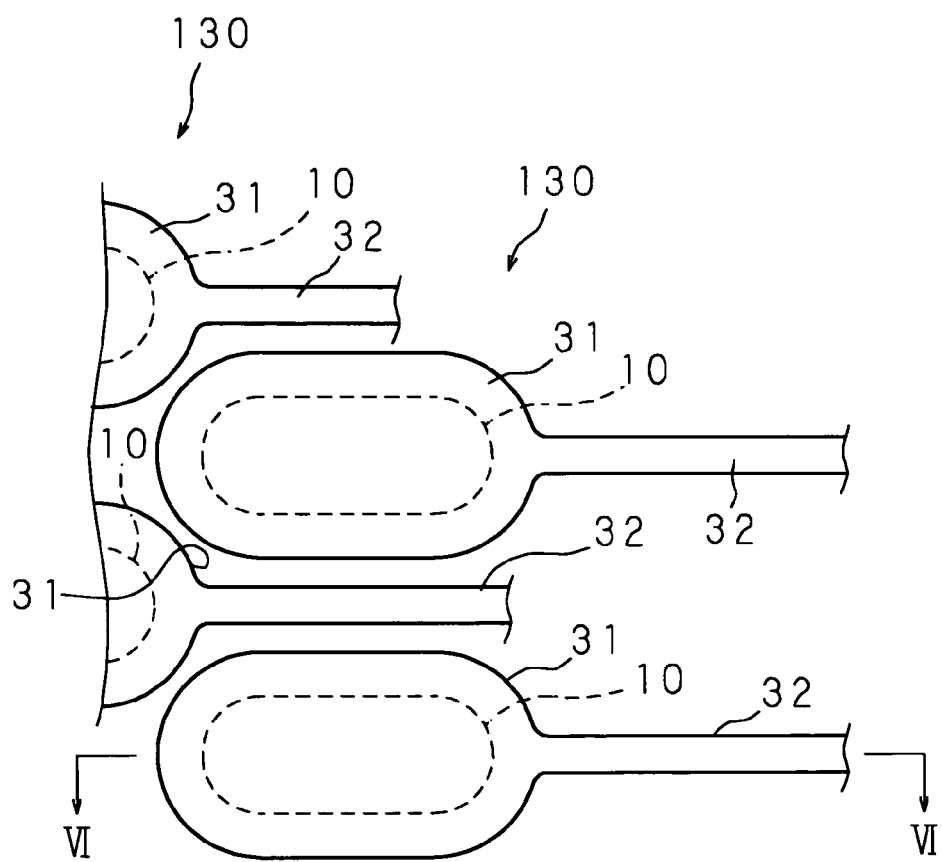
FIG. 1 is a plan view showing the structure of a conventional circuit board.
Figure 2:
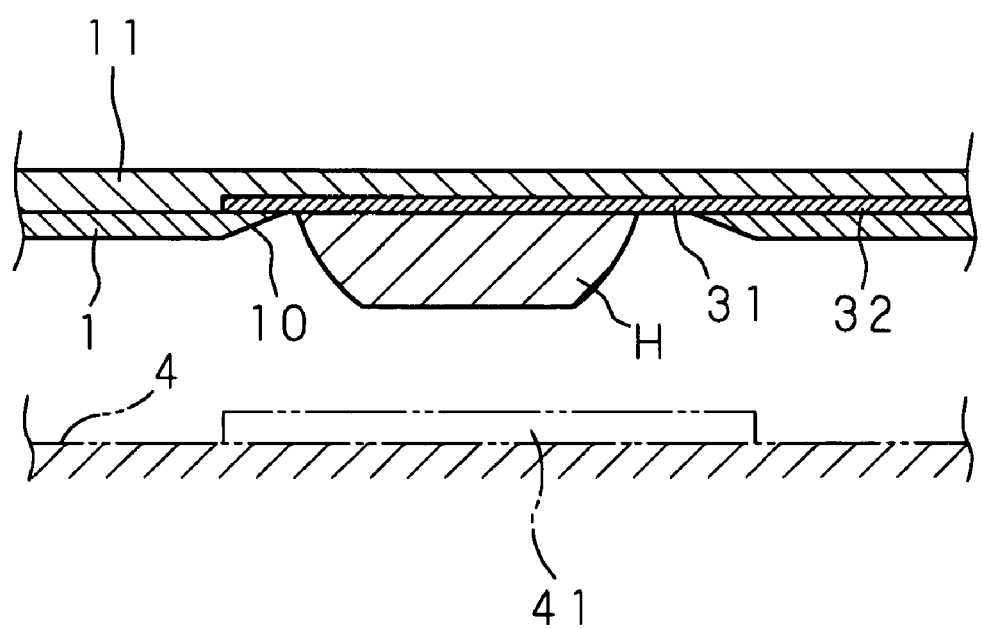
FIG. 2 is a cross sectional view along the VI-VI line of FIG. 1.
Figure 3:
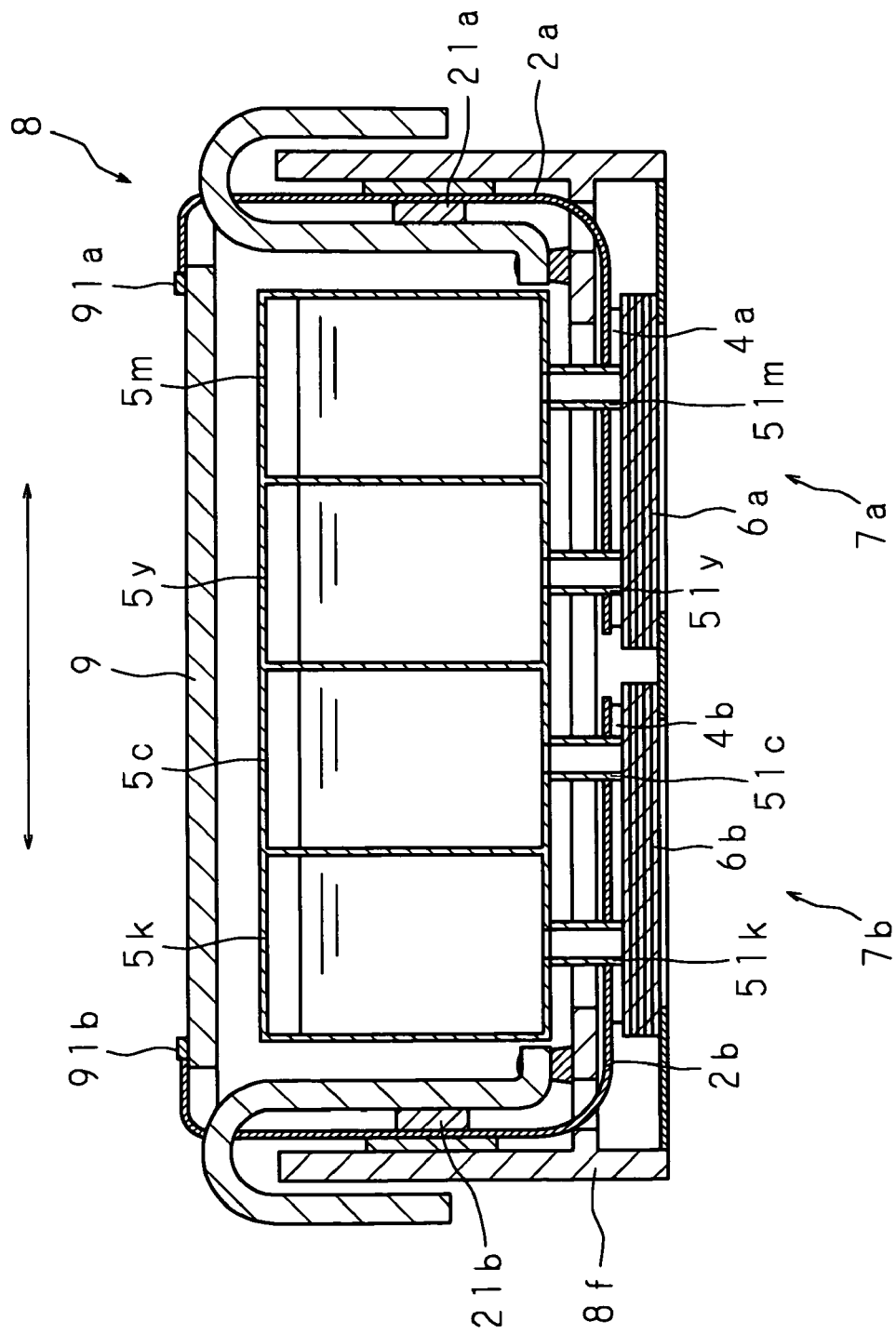
FIG. 3 is a sectional side view showing the structure of an inkjet head comprising a circuit board of this embodiment.

The following description will explain in detail the present embodiment referring to the drawings. An inkjet head 8 generally comprises a frame 8f in the shape of a box, recording heads 7a and 7b incorporated in the lower part of the frame 8f, and ink tanks 5k, 5c, 5y and 5m incorporated in the upper part of the frame 8f, and opens the nozzle holes formed in the lower surfaces of the recording heads 7a and 7b and ejects ink droplets downward. Similarly to a known inkjet head, nozzle holes are arranged in zigzag in two rows for each color. The inkjet head 8 is placed to face recording paper and reciprocally moves in directions parallel to the recording paper (the directions shown by arrows in FIGS. 3 and 4) in a known manner.

The ink tanks 5k, 5c, 5y and 5m store color inks of black, cyan, yellow, and magenta, respectively. A part corresponding to black (cyan, yellow, magenta) will be hereinafter designated with a letter k (c, y, m). A printed board 9 to be connected to a control circuit in a printer main body is placed horizontally above the ink tanks 5k, 5c, 5y and 5m.

Figure 4:
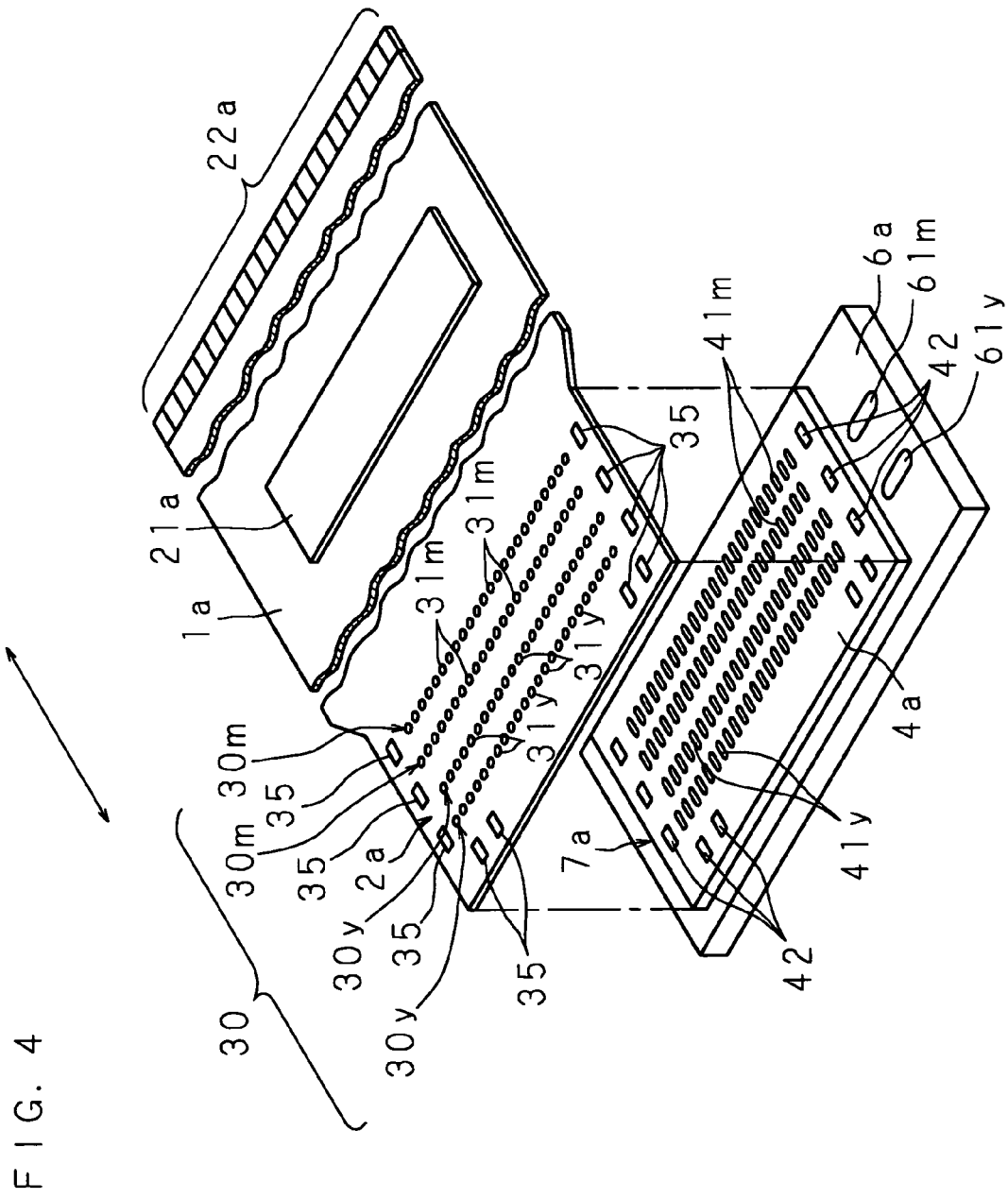
FIG. 4 is an exploded perspective view showing the structures of the circuit board and recording head in the inkjet head.

For the recording heads 7a and 7b, two heads of the same structure are arranged in the moving direction of the inkjet head 8, and they are composed of cavity plates 6a, 6b and piezoelectric actuator plates (actuators) 4a, 4b, respectively. In the cavity plates 6a and 6b, ink supply ports (ink supply ports 61y and 61m are shown in FIG. 4) connecting to the ink tanks 5k, 5c, 5y and 5m through ink supply tubes 51k, 51c, 51y and 51m are formed. The piezoelectric actuator plates 4a and 4b are stacked and fixed on the cavity plates 6a and 6b, have piezoelectric driving sections (not shown) corresponding to the respective ink channels formed and connected to the respective nozzle holes in the cavity plates 6a and 6b, and selectively deform a piezoelectric driving section to apply pressure to the ink in the corresponding ink channel and eject ink droplets from the nozzle holes.

On the upper surfaces of the piezoelectric actuator plates 4a and 4b, first individual electrodes (electrode group) to which a drive signal for deforming the respective piezoelectric driving sections of the piezoelectric actuator plates 4a and 4b is given are formed and arranged in zigzag in two rows for each color at positions almost corresponding to the positions of the nozzle holes. Moreover, first common electrodes to be grounded through later-described second common electrodes are formed on the periphery of the upper surfaces of the piezoelectric actuator plates 4a and 4b. In FIG. 4, the first individual electrodes 41y, 41y, . . . , 41m, 41m, . . . and the first common electrodes 42, 42, . . . are shown. Each of the first individual electrodes 41y, 41y, . . . , 41m, 41m, . . . is connected on a one-to-one basis to one end of each piezoelectric driving section, and the first common electrodes 42, 42, . . . are connected in common to the other end of all piezoelectric driving sections. The number of the first common electrodes 42 may be one, or more than one.

The inkjet head 8 comprises circuit boards 2a and 2b corresponding to the recording heads 7a and 7b. Since the recording head 7a and the circuit board 2a, and the recording head 7b and the circuit board 2b have substantially the same structures symmetrical in the moving direction about the middle section between the recording head 7a and circuit board 2a and the recording head 7b and circuit board 2b (substantially bisymmetrical), the following description will be given about the recording head 7a and the circuit board 2a.

In the circuit board 2a, a terminal section 22a to be connected to a connector 91a formed on the upper surface of the printed board 9 is formed at one end portion in a longitudinal direction of a rectangular flexible sheet (board) 1a made of a polyimide insulating film having flexibility. Moreover, at the other end portion in the longitudinal direction, an electrode section 30 to be connected to the respective first individual electrodes 41y, 41y, . . . , 41m, 41m, . . . and first common electrodes 42, 42, . . . is provided. A drive circuit (IC chip) 21a is mounted at the center in the longitudinal direction of the flexible sheet 1a, and supplied with electric power and a drive signal from the control circuit in the printer main body through the printed board 9, and outputs the electric power and signal to the electrode section 30.

The circuit board 2a is placed so that its longitudinal direction is aligned with a horizontal direction (lateral moving direction) orthogonal to the row direction of the first individual electrodes 41y, 41y, . . . , 41m, 41m . . . , the other end portion in the longitudinal direction is stacked on the upper surface of the piezoelectric actuator plate 4a, and the electrode section 30 is connected to the respective first individual electrodes 41y, 41y, 41m, 41m, . . . and first common electrodes 42, 42, . . . . Further, the terminal section 22a at the one end portion in the longitudinal direction of the circuit board 2a is connected to the connector 91a of the printed board 9. (The circuit board 2b is connected to a connector 91b, and an IC chip 21b mounted on the circuit board 2b is also supplied with the electric power and drive signal through the printed board 9.)

Figure 5:
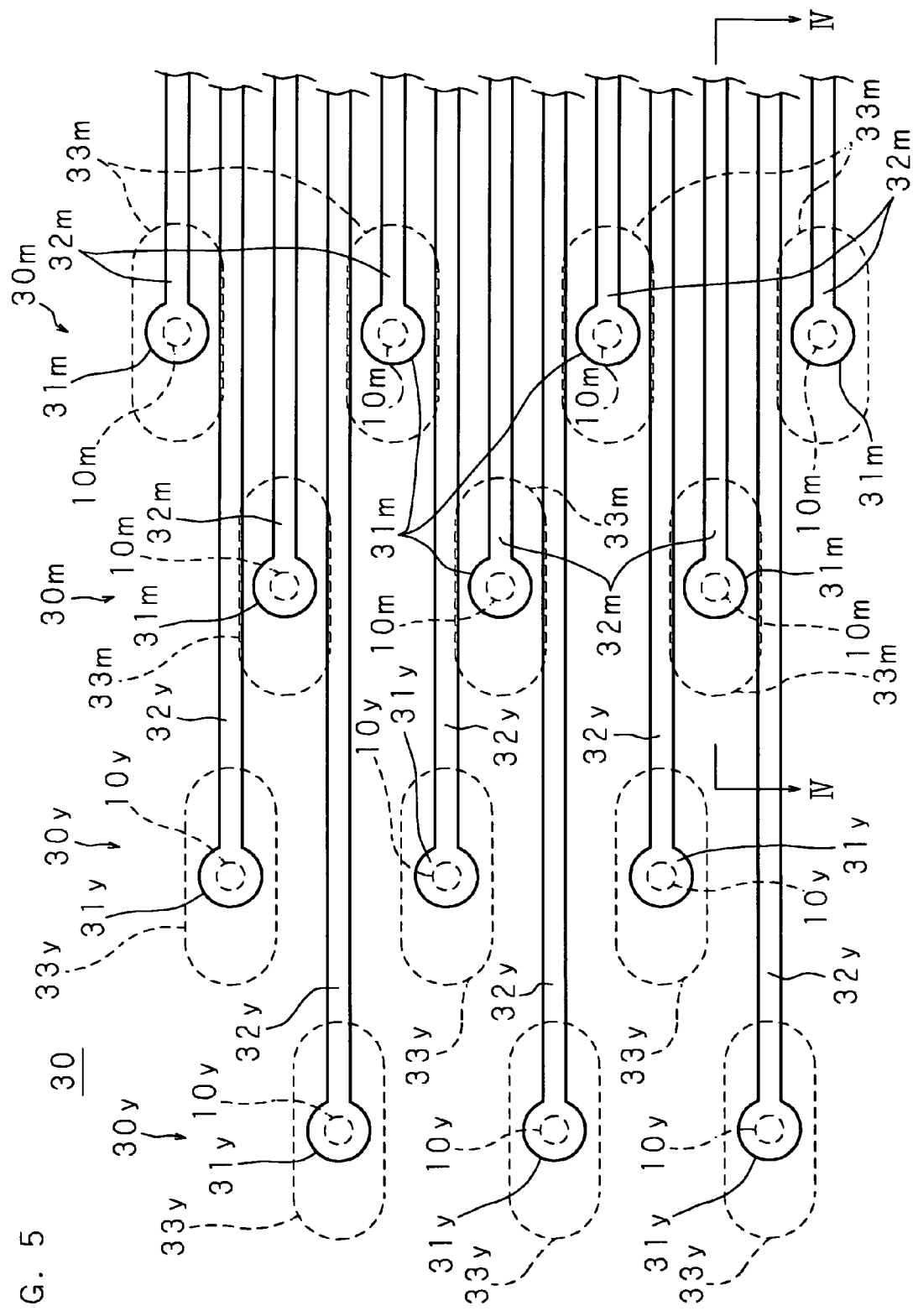
FIG. 5 is an enlarged plan view showing the structure of an electrode section of the circuit board.

The electrode section 30 comprises, at the center in the other end portion in the longitudinal direction of the circuit board 2a, two electrode rows 30y, 30y and two electrode rows 30m, 30m corresponding to the two rows of first individual electrodes 41y, 41y, . . . and two rows of first individual electrodes 41m, 41m, . . . , respectively, on the piezoelectric actuator plate 4a. Each electrode row 30y includes the second individual electrodes (electrodes) 31y, 31y, . . . having a circular shape in the plan view and corresponding to the respective first individual electrodes 41y, 41y, . . . , and, as shown in FIG. 5, the second individual electrodes 31y, 31y, . . . included in adjacent electrode rows 30y and 30y are arranged in a zigzag pattern by shifting their positions in the row direction from each other. Similarly, each electrode row 30m includes the second individual electrodes (electrodes) 31m, 31m, . . . having a circular shape in the plan view and corresponding to the respective first individual electrodes 41m, 41m, . . . , and the second individual electrodes 31m, 31m, . . . included in adjacent electrode rows 30m and 30m are arranged in a zigzag pattern by shifting their positions in the row direction from each other.

Moreover, the electrode section 30 comprises second common electrodes 35, 35, . . . corresponding to the first common electrodes 42, 42, . . . at the periphery of the other end portion in the longitudinal direction of the circuit board 2a. The second common electrodes 35, 35, . . . are respectively grounded through a ground wiring, not shown.

Wirings 32y, 32y, . . . , 32m, 32m, . . . having a width smaller than the external diameter of the second individual electrodes 31y, 31y, . . . , 31m, 31m, . . . are connected to one side of the respective second individual electrodes 31y, 31y, . . . , 31m, 31m, and extend in the longitudinal direction of the flexible sheet 1a, that is, a direction crossing the electrode rows 30y, 30m, 30m. In other words, the wirings 32y, 32y, . . . , 32m, 32m, . . . pass between the second individual electrodes 31y, 31y, . . . , 31m, 31m, . . . in the electrode rows located closer to the IC chip 21a than the second individual electrodes 31y, 31y, . . . , 32m, 32m, . . . to which they are connected in the arrangement direction of the electrode rows 30y, 30y, 30m, 30m, and are connected to the IC chip 21a.

On one surface (hereinafter referred to as the front surface) of the flexible sheet 1a, an insulating layer 11a (FIG. 6) is formed to cover the second individual electrodes 31y, 31y, . . . , 31m, 31m, . . . , and the wirings 32y, 32y, . . . , 32m, 32m, . . . . Further, through-holes 10y, 10y, . . . , 10m, 10m, . . . having a circular shape in the plan view are formed in the flexible sheet 1a at the formation positions of the second individual electrodes 31y, 31y, . . . , 31m, 31m, . . . so that their center positions are aligned with the center positions of the second individual electrodes 31y, 31y, . . . , 31m, 31m, . . . .

Figure 6:
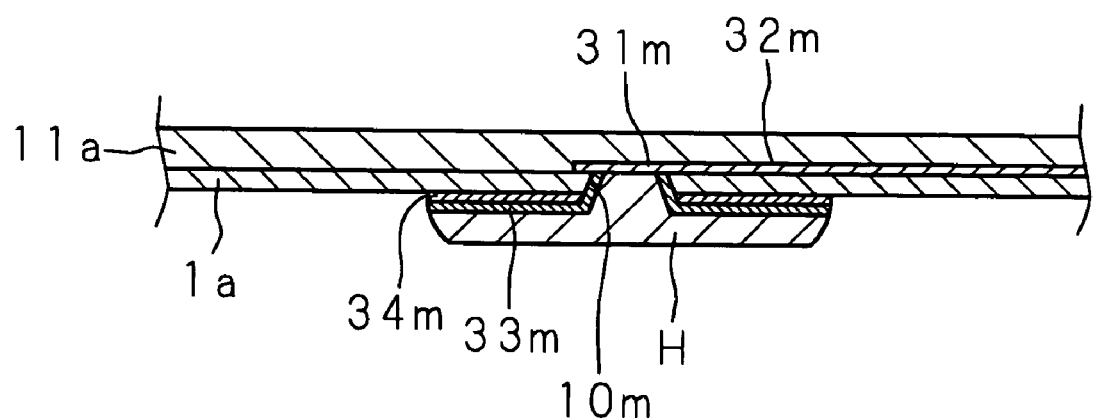
FIG. 6 is a cross sectional view along the IV-IV line of FIG. 5.

The opening area of each of the through-holes 10y, 10y, . . . , 10m, 10m, . . . on the front surface side of the flexible sheet 1a is smaller than the area of the second individual electrodes 31y, 31y, . . . , 31m, 31m, . . . . As shown in FIG. 6, the opening area on the other surface (rear surface) side is larger than the above-mentioned opening area, but is smaller than the second individual electrodes 31y, 31y, . . . , 31m, 31m, . . . .

For the respective second individual electrodes 31y, 31y, . . . , 31m, 31m, . . . , copper electrode connection sections 33y, 33y, . . . , 33m, 33m, . . . are formed over the through-holes 10y, 10y, . . . , 10m, 10m, . . . , and the rear surfaces of flexible sheet 1a. The following description will explain about one of the second individual electrodes 31 (FIG. 6).

For the second individual electrode 31m, the electrode connection section 33m has a plane in the shape of an oval elongated in the arrangement direction of the electrode rows 30y, 30y, 30m, 30m (the longitudinal direction of the wirings 32y, 32y, 32m, 32m, . . . ) and an area larger than the area of the second individual electrode 31m, and is electrically connected to the second individual electrode 31m through the through-hole 10m. A lower electrode layer (an electrode layer) 34m is interposed between the electrode connection section 33m and the rear surface of the flexible sheet 1a. The lower electrode layer 34m is made of the same electrically conductive material as an electrically conductive material forming the second individual electrode 31m.

An electrically conductive brazing filler metal (solder) H is deposited on the electrode connection section 33m. At this time, the solder H and the second individual electrode 31m are connected through the through-hole 10m covered with the electrode connection section 33m. Even when the direct connection between the solder H and the second individual electrode 31m is defective, there will be no problem because the solder H and the second individual electrode 31m are connected through the electrode connection section 33m.

The second common electrode 35 has the same structure as the second individual electrode 31m, and is connected to an electrode connection section (not shown) facing the first common electrode 42 on the piezoelectric actuator plate 4a on the lower surface of the flexible sheet 1a. Moreover, an electrically conductive brazing filler metal (solder) is deposited on the lower surface of the electrode connection section.

By placing the second individual electrodes 31y, 31m and the second common electrodes 35 of the circuit board 2a over the first individual electrodes 41y, 41m and the first common electrodes 42 on the piezoelectric actuator plate 4a and applying heat to melt the solder H pre-deposited on the second individual electrodes 31y, 31m and the second common electrodes 35, it is possible to electrically connect the second individual electrodes 31y, 31y and the second common electrodes 35 to the first individual electrodes 41y, 41m and the first common electrodes 42.

Since the electrode connection sections 33y and 33m are connected to the first individual electrodes 41y and 41m on the rear surface of the flexible sheet 1a, it is possible to ensure a sufficient area of the electrode connection sections 33y and 33m for connecting to the first individual electrodes 41y and 41m, irrespective of the wirings 32y and 32m on the front surface. Consequently, the second individual electrodes 31y, 31m on the front surface may just have a minimum area necessary for connecting to the electrode connection sections 33*y*, 33*m* through the through-holes 10*y*, 10*m*.

As a result, it becomes possible to decrease the pitch of forming the second individual electrodes 31*y*, 31*m* and the electrode connection sections 33*y*, 33*m* on the front surface. Consequently, since it is possible to decrease the pitch of forming the nozzle holes in the row direction and increase the number of nozzle holes without changing the length of the row of nozzle holes, the resolution of an image can be improved. Alternatively, it may be possible to form the same number of nozzle holes and decrease the size of the inkjet head 8. Or it may be possible to further improve the resolution or increase the number of colors of inks by increasing the number of wirings passing between the second individual electrodes 31*y*, 31*m*, that is, for example, by increasing the number of electrode rows 30*y*, 30*y*, 30*m*, 30*m* compared to the conventional number of electrode rows.

Figure 7A:
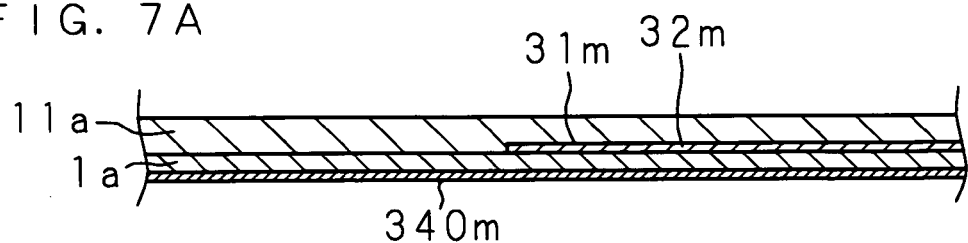
FIGS. 7A to 7D are cross sectional views for explaining a method of manufacturing a circuit board.

In order to form the above-mentioned circuit board 2*a*, as shown in FIG. 7A, first, the second individual electrodes 31*y*, 31*m*, the second common electrodes 35, and wirings connecting them are formed on the front surface of the flexible sheet 1*a* by a known technique, such as etching and printing, and covered with the insulating layer 11*a*. Then, an electrically conductive material layer to be a lower electrode layer is formed over the entire rear surface of the flexible sheet 1*a*. The following description will be explained by representing the second individual electrodes 31*m* as the second individual electrodes and second common electrodes, the wirings 32*m* as the wirings, the electrode connection sections 33*m* as the electrode connection sections, the lower electrode layer 34*m* as the lower electrode layer, and an electrically conductive material layer 340*m* as the electrically conductive material layer.

Figure 7B:
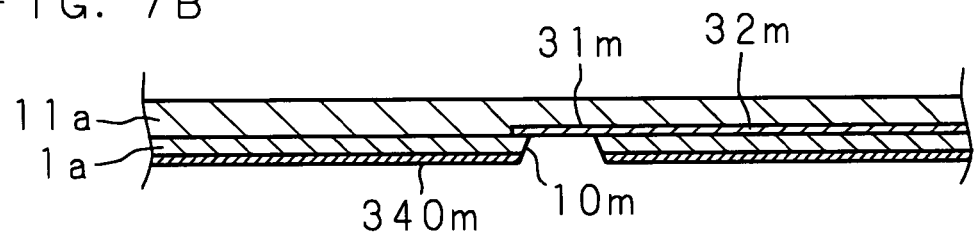

Next, as shown in FIG. 7B, laser light is irradiated on a position corresponding to the second individual electrode 31*m* on the rear surface of the flexible sheet 1*a*, and the electrically conductive material layer 340*m* to be the lower electrode layer 34*m* and the flexible sheet 1*a* are removed by abrasion to form the through-hole 10*m*.

Figure 7C:
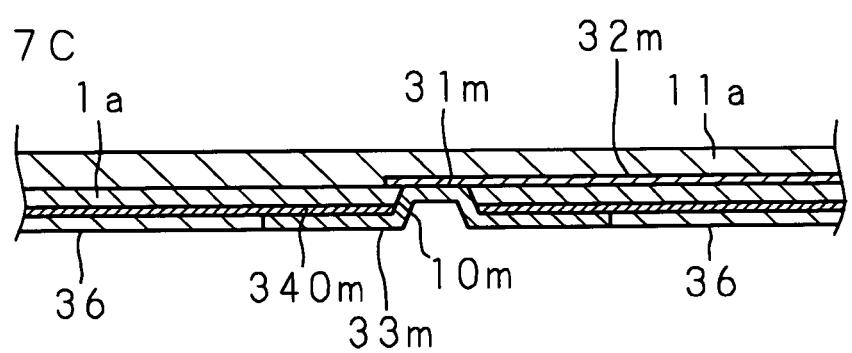

Thereafter, as shown in FIG. 7C, a resist film 36 is formed on the electrically conductive material layer 340*m* to be the lower electrode layer 34*m* by leaving only a portion corresponding to the lower electrode layer 34*m*, and the electrode connection section 33*m* is formed by copper plating on the electrically conductive material layer 340*m* and second individual electrode 31*m* exposed from the resist film 36. The electrode connection section 33*m* is thicker than the lower electrode layer 34*m*, and is also formed along the inner surface of the through-hole 10*m* so as to connect the copper on the lower electrode layer 34*m* and the copper on the second individual electrode 31*m*.

Figure 7D:
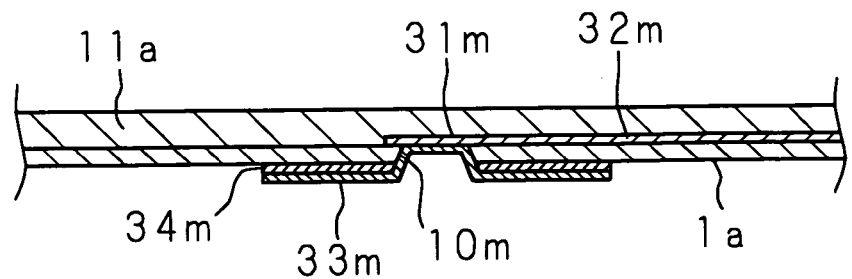

Then, the resist film 36 is removed, and further an etching treatment is performed on the electrode connection section 33*m* and the electrically conductive material layer 340*m* to remove a portion of the electrically conductive material layer 340*m* constituting the lower electrode layer 34*m*, which does not overlap the electrode connection section 33, as shown in FIG. 7D, thereby forming the lower electrode layer 34. At this time, the etching treatment is performed to such a degree that the electrode connection section 33*m* is not completely removed though the thickness of the electrode connection section 33*m* is decreased.

Then, the solder H is deposited on the electrode connection section 33*m* by plating.

According to this embodiment, since the electrodes are arranged in a zigzag pattern, the electrode connection sections are also arranged in a zigzag pattern. Therefore, the interval between electrode connection sections adjacent to each other in the arrangement direction of the electrode rows can be made larger than an interval seen from the arrangement direction, and the connection area between the electrode connection section and an external electrode can be increased. Besides, even when the area of the electrode connection section is increased as described above, it is possible to ensure the electrode pitch and the wiring pitch on one surface of the board as described above, and it is possible to arrange the electrodes at high density, or place a large number of electrodes.

As this description may be embodied in several forms without departing from the spirit of essential characteristics thereof, the present embodiment is therefore illustrative and not restrictive, since the scope is defined by the appended claims rather than by the description preceding them, and all changes that fall within metes and bounds of the claims, or equivalence of such metes and bounds thereof are therefore intended to be embraced by the claims.

The invention claimed is:

1. A circuit board comprising:
   a plurality of electrode rows arranged on one surface of a board;
   wirings formed on said one surface and connected to a plurality of electrodes, respectively, included in said electrode rows;
   through-holes formed in the board, corresponding to said plurality of electrodes, respectively; and
   electrode connection sections each comprising a metal layer formed on an electrode layer—arranged between the metal layer and other surface of the board—and on an inner surface of the through-hole to face and be connected to an external electrode group via an electrically conductive brazing filler metal deposited on the metal layer in the through-hole and on the metal layer on the electrode layer, said metal layer having an area larger than an area of said electrode and being connected to said electrode through said through-hole,
   wherein the wiring connected to the electrode included in one of said electrode rows is formed to pass between the electrodes included in other electrode row in an arrangement direction of said electrode rows,
   said through-hole has an area smaller than the area of said electrode, and
   the electrode layer is made of the same material as a material forming the electrode.

2. The circuit board according to claim 1, wherein the electrodes included in adjacent electrode rows are arranged in a zigzag pattern by shifting their positions in a row direction from each other, and said electrode connection section has a shape elongated in the arrangement direction.

3. The circuit board according to claim 1, wherein the center positions of the through-holes are aligned with the center positions of the electrodes.

4. The circuit board according to claim 1, wherein an area of each of the through-holes on the other surface side of the board is larger than the area of each of the through-holes on the one surface side of the board, and is smaller than the area of each of the electrodes.

5. The circuit board according to claim 1, wherein the wirings have widths smaller than the electrodes.

6. An inkjet head comprising:
   an actuator having an electrode group corresponding to each of a plurality of nozzle holes, for ejecting ink from each of the nozzle holes; and
   a circuit board connected to said actuator, wherein said circuit board is the circuit board defined in claim 1, and each of said plurality of electrode connection sections is arranged to face said electrode group, and said electrode connection sections and the electrodes included in said electrode group are connected.

7. The inkjet head according to claim 6, wherein said electrode connection sections are connected to the electrodes via the electrically conductive brazing filler metals.

8. The circuit board according to claim 1, further comprising the electrically conductive brazing filler metal deposited on a first portion of the electrode connection sections, wherein the electrode connection sections are connected to the electrodes at a second portion of the electrode connection sections.

9. The circuit board according to claim 1, wherein said electrode connection section covers the inner surface of said through hole.

* * * * *